(12) United States Patent
Treu et al.

(10) Patent No.: US 12,506,051 B2
(45) Date of Patent: Dec. 23, 2025

(54) SEMICONDUCTOR PACKAGE COMPRISING A CAVITY WITH EXPOSED CONTACTS AND A SEMICONDUCTOR MODULE

(71) Applicant: Infineon Technologies Austria AG, Villach (AT)

(72) Inventors: Julian Treu, Munich (DE); Ivan Nikitin, Regensburg (DE); Bernd Schmoelzer, Radenthein (AT)

(73) Assignee: Infineon Technologies Austria AG, Villach (AT)

( * ) Notice: Subject to any disclaimer, the term of this patent is extended or adjusted under 35 U.S.C. 154(b) by 578 days.

(21) Appl. No.: 17/949,419

(22) Filed: Sep. 21, 2022

(65) Prior Publication Data

US 2023/0093341 A1 Mar. 23, 2023

(30) Foreign Application Priority Data

Sep. 22, 2021 (EP) .................................... 21198257

(51) Int. Cl.
*H01L 23/495* (2006.01)
*H01L 23/00* (2006.01)
(Continued)

(52) U.S. Cl.
CPC ...... *H01L 23/4952* (2013.01); *H01L 23/3121* (2013.01); *H01L 24/45* (2013.01);
(Continued)

(58) Field of Classification Search
CPC . H01L 23/4952; H01L 23/3121; H01L 24/45; H01L 24/48; H01L 25/16; H01L 2224/45124; H01L 2224/45144; H01L 2224/45147; H01L 2224/48247; H01L 2924/10253; H01L 2924/10272; H01L 2924/1033; H01L 2924/13055; H01L 2924/13091; H01L 2924/1815; H01L 23/3107; H01L 23/62; H01L 25/165;
(Continued)

(56) References Cited

U.S. PATENT DOCUMENTS 5,455,390 A * 10/1995 DiStefano ......... H01L 23/49827
361/776
5,726,493 A * 3/1998 Yamashita ........ H01L 23/49816
257/E23.092

(Continued)

FOREIGN PATENT DOCUMENTS

CN 109449150 A * 3/2019
CN 110416180 A * 11/2019
(Continued)

*Primary Examiner* — Earl N Taylor
(74) *Attorney, Agent, or Firm* — Murphy, Bilak & Homiller, PLLC

(57) ABSTRACT

A semiconductor package comprising a substrate, at least one semiconductor die disposed on the substrate, at least one electrical connector connected with the semiconductor die, an encapsulant covering the substrate, the at least one semiconductor die, and at least partially the electrical connector, the encapsulant comprising a recess formed into a main surface of the encapsulant, wherein the at least one electrical connector is exposed within the recess.

16 Claims, 5 Drawing Sheets

(51) Int. Cl.
*H01L 23/31* (2006.01)
*H01L 25/16* (2023.01)
*H05K 1/18* (2006.01)
(52) U.S. Cl.
CPC ............ *H01L 24/48* (2013.01); *H01L 25/16* (2013.01); *H05K 1/18* (2013.01); *H01L 2224/45124* (2013.01); *H01L 2224/45144* (2013.01); *H01L 2224/45147* (2013.01); *H01L 2224/48247* (2013.01); *H01L 2924/10253* (2013.01); *H01L 2924/10272* (2013.01); *H01L 2924/1033* (2013.01); *H01L 2924/13055* (2013.01); *H01L 2924/13091* (2013.01); *H01L 2924/1815* (2013.01); *H05K 2201/10166* (2013.01); *H05K 2201/10659* (2013.01); *H05K 2201/10901* (2013.01); *H05K 2201/10939* (2013.01)

(58) Field of Classification Search
CPC ......... H01L 23/49562; H01L 23/49575; H01L 23/49811; H01L 24/40; H01L 2224/40227; H01L 2224/45015; H01L 2224/48091; H01L 2224/48227; H01L 2924/181; H05K 1/18; H05K 2201/10166; H05K 2201/10659; H05K 2201/10901; H05K 2201/10939; H05K 1/141
See application file for complete search history.

(56) References Cited

U.S. PATENT DOCUMENTS

| | | | | |
|---|---|---|---|---|
| 5,989,939 A * | 11/1999 | Fjelstad | ................ | H01L 24/13 438/117 |
| 6,653,170 B1 * | 11/2003 | Lin | ................ | H01L 21/563 438/117 |
| 6,694,609 B2 * | 2/2004 | Lopata | ................ | H01R 13/33 29/841 |
| 6,722,896 B2 * | 4/2004 | McGrath | ................ | H01R 43/007 439/271 |
| 7,355,289 B2 * | 4/2008 | Hess | ................ | H01L 24/49 257/E23.101 |
| 7,517,733 B2 * | 4/2009 | Camacho | ................ | H01L 23/49811 438/123 |
| 7,855,462 B2 * | 12/2010 | Boon | ................ | H01L 24/81 257/784 |
| 8,138,584 B2 * | 3/2012 | Wang | ................ | H01L 23/49575 257/659 |
| 8,372,741 B1 * | 2/2013 | Co | ................ | H01L 25/0657 219/56.22 |
| 8,772,152 B2 * | 7/2014 | Co | ................ | H01L 23/3128 219/56.22 |
| 8,878,353 B2 * | 11/2014 | Haba | ................ | H05K 1/11 438/109 |
| 9,209,081 B2 * | 12/2015 | Lim | ................ | H01L 24/19 |
| 9,691,679 B2 * | 6/2017 | Co | ................ | H01L 23/3121 |
| 10,290,585 B2 * | 5/2019 | Nguyen | ................ | H01L 24/49 |
| 11,288,476 B2 * | 3/2022 | Nilsson | ................ | G06V 40/13 |
| 11,942,386 B2 * | 3/2024 | Manack | ................ | H01L 21/565 |
| 2002/0014004 A1 * | 2/2002 | Beaman | ................ | G01R 1/07342 29/842 |
| 2004/0173899 A1 * | 9/2004 | Peng | ................ | H01L 23/4952 257/E23.128 |
| 2007/0222087 A1 * | 9/2007 | Lee | ................ | H01L 24/13 257/784 |
| 2007/0254406 A1 * | 11/2007 | Lee | ................ | H01L 25/0657 438/109 |
| 2008/0246133 A1 * | 10/2008 | Derderian | ................ | H01L 24/73 257/678 |
| 2009/0085205 A1 * | 4/2009 | Sugizaki | ................ | B81B 7/007 257/E21.59 |
| 2009/0108425 A1 * | 4/2009 | Lee | ................ | H01L 23/49816 257/679 |
| 2010/0314748 A1 * | 12/2010 | Hsu | ................ | H01L 23/3128 257/693 |
| 2012/0032350 A1 * | 2/2012 | Warren | ................ | H01L 24/49 257/782 |
| 2012/0074552 A1 * | 3/2012 | Mashimo | ................ | H01L 23/49531 257/676 |
| 2012/0319260 A1 * | 12/2012 | Kim | ................ | H01L 23/4334 257/676 |
| 2013/0095610 A1 * | 4/2013 | Chau | ................ | H01L 21/56 438/109 |
| 2014/0220744 A1 * | 8/2014 | Damberg | ................ | H01L 21/4853 438/127 |
| 2014/0231980 A1 * | 8/2014 | Lim | ................ | H01L 23/3107 257/690 |
| 2014/0264808 A1 * | 9/2014 | Wolter | ................ | H01L 23/3128 257/774 |
| 2015/0017765 A1 * | 1/2015 | Co | ................ | B23K 20/007 438/126 |
| 2015/0069537 A1 * | 3/2015 | Lo | ................ | G01L 19/0076 438/51 |
| 2017/0125395 A1 | 5/2017 | Hohlfeld et al. | | |
| 2017/0192038 A1 * | 7/2017 | Kawamoto | ................ | G01R 1/203 |
| 2018/0182719 A1 * | 6/2018 | Muto | ................ | H01L 23/4952 |
| 2019/0006258 A1 * | 1/2019 | Muto | ................ | H01L 23/4006 |
| 2019/0146007 A1 * | 5/2019 | Takaishi | ................ | H01C 13/00 324/115 |
| 2019/0221549 A1 * | 7/2019 | Hayashi | ................ | H01L 24/48 |
| 2020/0011899 A1 * | 1/2020 | Tsukahara | ................ | H01C 7/06 |
| 2020/0202100 A1 * | 6/2020 | Nilsson | ................ | G01L 1/22 |
| 2022/0059423 A1 * | 2/2022 | Manack | ................ | H01L 23/315 |
| 2022/0278089 A1 * | 9/2022 | Chen | ................ | H01L 24/73 |
| 2022/0352114 A1 * | 11/2022 | Nikitin | ................ | H01L 23/49562 |
| 2022/0392857 A1 * | 12/2022 | Rice | ................ | H01L 24/48 |
| 2023/0048878 A1 * | 2/2023 | Schuderer | ................ | H01L 23/473 |
| 2024/0234231 A1 * | 7/2024 | Manack | ................ | H01L 24/73 |

FOREIGN PATENT DOCUMENTS

| | | | | |
|---|---|---|---|---|
| JP | H0766332 A | * | 3/1995 | |
| JP | H11260850 A | * | 9/1999 | |
| JP | 2011223644 A | * | 11/2011 | |
| JP | 2017133928 A | * | 8/2017 | |
| TW | 201401455 A | * | 1/2014 | ............ H01L 24/19 |
| TW | 201409639 A | * | 3/2014 | ............ H01L 21/56 |
| WO | WO-2018208205 A1 | * | 11/2018 | ............ G01L 1/14 |
| WO | 2020235056 A1 | | 11/2020 | |
| WO | 2021151949 A1 | | 8/2021 | |

* cited by examiner

SEMICONDUCTOR PACKAGE COMPRISING A CAVITY WITH EXPOSED CONTACTS AND A SEMICONDUCTOR MODULE

TECHNICAL FIELD

The present disclosure is related to a semiconductor package and to a semiconductor module comprising such a semiconductor package.

BACKGROUND

In the semiconductor industry, there is a continuous striving to increase integration density. Higher integration is beneficial for customers as the area on a printed circuit board is rather costly. Furthermore the distance between the gate connection and the gate driver needs to be as short as possible for increased performance. On the other hand, a minimum distance between signal pins (gate, sense) and power pins (source, drain) needs to be maintained in order to achieve the required creepage and clearance distances. This limits the minimum package size for higher voltage domains with standard lead configurations.

Furthermore large packages still need to maintain low package bow in order to have sufficient thermal contact with the heat sink. One solution is to go to thicker packages. However, this added volume usually has no additional benefit.

For these and other reasons there is a need for the present disclosure.

SUMMARY

A first aspect of the present disclosure is related to a semiconductor package comprising a substrate, at least one semiconductor die disposed on the substrate, at least one electrical connector connected with the semiconductor die, an encapsulant covering the substrate, the at least one semiconductor die, and at least partially the electrical connector, the encapsulant comprising a recess formed into a main surface of the encapsulant, wherein the at least one electrical connector is exposed within the recess.

A second aspect of the present disclosure is related to a semiconductor module comprising a semiconductor package comprising a substrate, at least one semiconductor die disposed on the substrate, the semiconductor die comprising at least one electrical connector, an encapsulant covering the substrate, the at least one semiconductor die, and at least partially the electrical connector, the encapsulant comprising a recess formed into a main surface of the encapsulant, wherein the at least one electrical connector is exposed within the recess, and a printed circuit board disposed in or on the recess, the printed circuit board comprising a semiconductor driver die disposed thereon, the semiconductor driver die being electrically connected with the exposed electrical connector.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DESCRIPTION OF EMBODIMENTS

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the abovementioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

DETAILED DESCRIPTION

Figure 1A:
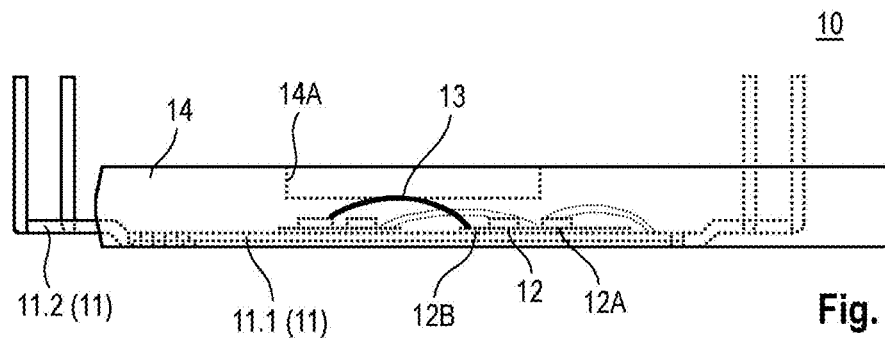
FIG. 1 comprises FIGS. 1A and 1B and shows a schematic cross-sectional side view (A) and a perspective view (B) of an example of a semiconductor package.
Figure 1B:
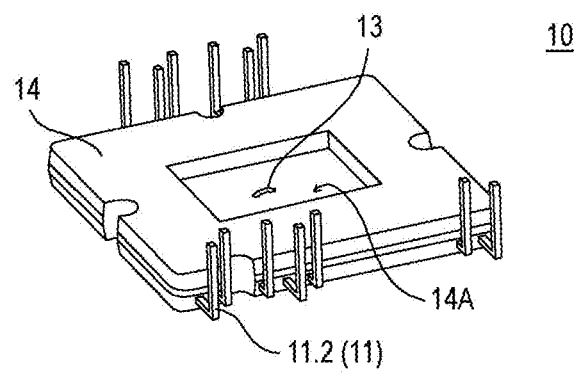

FIG. 1 comprises FIGS. 1A and 1B and shows a schematic cross-sectional side view (A) and a perspective view (B) of an example of a semiconductor package.

More specifically, FIG. 1 shows a semiconductor package 10 comprising a leadframe 11 which comprises a horizontal base plate 11.1 and external leads 11.2 extending out of the package 10. At least one semiconductor die 12 is disposed on the horizontal base plate 11.1 of the leadframe 11. The semiconductor die 12 can be a semiconductor transistor die 12 like, for example, an IGBT die or a MOSFET die. To this end, the semiconductor transistor die 12 comprises on its upper main face a source pad 12A, a gate pad 12B, and possibly also a source sense pad.

The semiconductor package 10 further comprises at least one electrical connector 13 connected with the semiconductor die 12. The electrical connector 13 can be a bond wire, a ribbon, or a clip and it can be connected with the gate pad 12A of the semiconductor transistor die 12.

The semiconductor package 10 further comprises an encapsulant 14 covering the substrate 11, the at least one semiconductor die 12, and at least partially the electrical connector 13, the encapsulant 14 comprising a recess 14A formed into a main surface of the encapsulant 14. The at least one electrical connector 13 is exposed at a bottom surface of the recess 14A.

In the embodiment of FIG. 1 only one exposed electrical connector 13 is shown which is connected with the gate pad 12A of the semiconductor transistor die 12. However, it is possible to arrange a plurality of exposed electrical connectors, in particular bond wires, for different purposes.

In particular, it is possible that two or more semiconductor transistor dies are disposed on the bottom surface of the cavity 14A. The semiconductor transistor dies can be interconnected to form an electrical circuit like, for example a half-bridge circuit, a full bridge circuit, a DC-DC converter, a DC-AC converter, or an AC-DC converter. In each one of these electrical circuits the gate pads of the respective semiconductor transistor dies can be connected with electrical conductors like the electrical connector 13 of FIG. 1 and part of or all of these electrical connectors can be exposed at the bottom surface of the cavity 14A.

In the embodiment of FIG. 1 the semiconductor package 10 further comprises a dummy pad, wherein the electrical connector 13 is connected with one end with the gate pad 12A and with another end with the dummy pad.

It is also possible that the electrical connector 13 is connected with both of its ends with the gate pad so that there is no need for a dummy pad.

A height of the recess 14A can be half of the thickness of the encapsulant 14. A thickness of the encapsulant 14 can be in a range from 4 mm to 6 mm. Besides that, the recess 14A can have a rectangular or quadratic shape.

Figure 2:
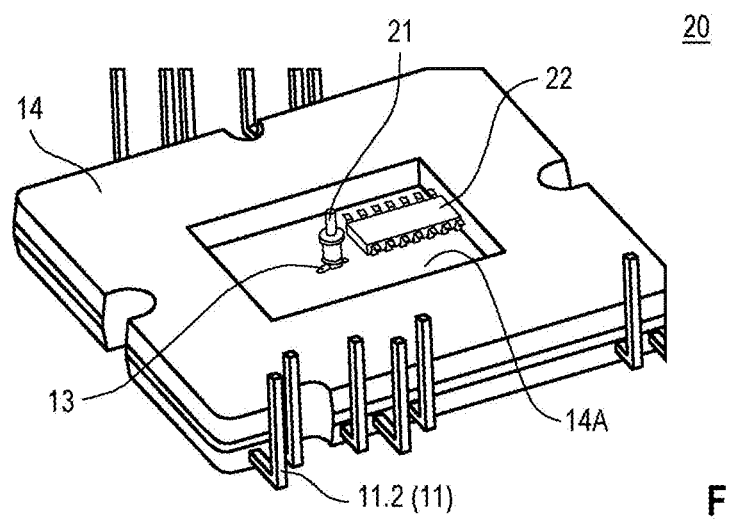
FIG. 2 shows a perspective view of an example of a semiconductor package provided with a press fit pin and a gate driver chip.

FIG. 2 shows a perspective view of an example of a semiconductor package provided with a press fit pin and a gate driver chip.

The semiconductor package 20 as shown in FIG. 2, can be similar to the semiconductor package 10 as was shown and described in connection with FIG. 1 so that the same reference signs are used. In addition to the semiconductor package 10 of FIG. 1, the semiconductor package 20 comprises a press fit pin 21, in particular a pogo pin 21, connected to the exposed bond wire 13. The pogo pin 21 serves the purpose of connecting a printed circuit board to the package which can be done, for example, at the customer side. Furthermore in addition to the semiconductor package 10 of FIG. 1, the semiconductor package 20 comprises a gate driver chip 22 applied to the bottom surface of the cavity 14. The gate driver chip 22 is connected with the gate pad of the semiconductor transistor die thereby serving for a short distance between driver chip and gate pad. The pogo pin 21 can be attached to the exposed bond wire 13 and the gate driver chip 22 can be attached to the bottom surface of the cavity 14A by conventional means like, for example, soldering, adhesive bonding, or gluing.

Figure 3:
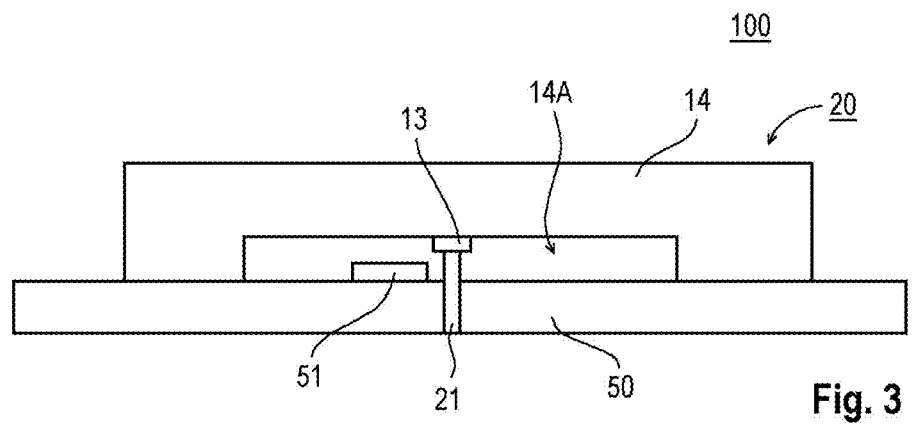
FIG. 3 shows a schematic cross-sectional side view of an example of a semiconductor module which comprises a printed circuit board connected to a semiconductor package by a press fit pin.

FIG. 3 shows a schematic cross-sectional side view of an example of a semiconductor module which comprises a printed circuit board connected to a semiconductor package by a press fit pin.

The semiconductor module 100 as shown in FIG. 3 comprises a semiconductor package 20 which can be similar to the semiconductor package 20 as was shown and described in connection with FIG. 2 so that the same reference signs are used. Accordingly the semiconductor package 20 comprises an encapsulant 14 and a cavity 14A formed in a main surface of the encapsulant 14.

In comparison with FIG. 2 some details of the semiconductor package 20 are omitted in FIG. 3 for reasons of simplicity and clarity. In particular, the semiconductor package 20 may comprise a leadframe which comprises a horizontal base plate and external leads extending out of the package 20. At least one semiconductor die may be disposed on the horizontal base plate of the leadframe which semiconductor die may be a semiconductor transistor die like, for example, an IGBT die or a MOSFET die. The semiconductor transistor die may comprise on its upper main face a source pad, a gate pad, and possibly also a source sense pad. An electrical connector 13 like, for example, a bond wire 13 is exposed at a bottom surface of the cavity 14A of the encapsulant 14. The bond wire 13 can be connected with the gate pad of the semiconductor transistor die.

The semiconductor module 100 further comprises a printed circuit board (PCB) 50 which is connected to the semiconductor package by means of the press fit pin 21. The PCB can be, for example, a commercially available so-called perfboard which is a PCB comprising a plurality of perforations, preferentially one with a rather low density of the perforations. One of the perforations can then be used to connect with the press fit pin 21.

The PCB can also be connected with the semiconductor package by other means. In particular, the semiconductor package does not need to have a press fit pin and the PCB can be connected to the semiconductor package by soldering, adhesive bonding, or gluing its main surface facing the cavity to the main surface of the semiconductor package.

The PCB 50 further comprises a gate driver chip 51 disposed on the main face facing the cavity 14A. The gate driver chip 51 is connected with the gate pad of the semiconductor transistor die thereby serving for a short distance between driver chip 51 and gate pad.

The PCB 50 may further comprise passive devices as, for example, resistors, capacitors or coils, on either one or both of its main surfaces.

Figure 4:
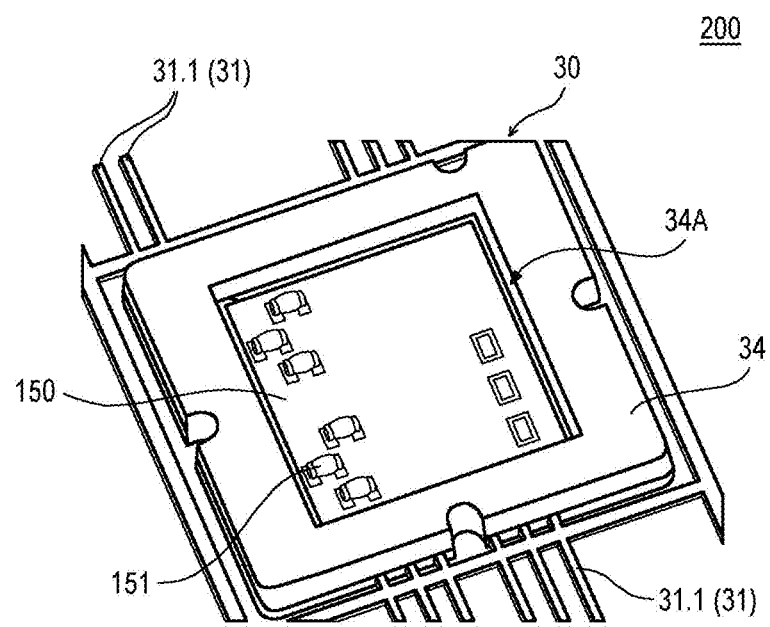
FIG. 4 shows a schematic perspective view of an example of a semiconductor module which comprises a plurality of passive devices on a back surface thereof.

FIG. 4 shows a schematic perspective view of an example of a semiconductor module which comprises a plurality of passive devices on a back surface thereof.

The semiconductor module 200 of FIG. 4 comprises a semiconductor package 30 which can be similar to either one of the semiconductor packages 10 or 20 as were shown and described in connection with FIG. 1 or 2. Accordingly the semiconductor package 30 comprises an encapsulant 34 and a cavity 34A formed into a main surface of the encapsulant 34. In particular, the semiconductor package 30 may comprise a leadframe 31 which comprises a horizontal base plate (not to be seen in the Figure) and external leads 31.1 extending out of the package 30. At least one semiconductor die (not to be seen in the Figure) may be disposed on the horizontal base plate of the leadframe 31 which semiconductor die may be a semiconductor transistor die like, for example, an IGBT die or a MOSFET die. The semiconductor transistor die may comprise on its upper main face a source pad, a gate pad, and possibly also a source sense pad. An electrical connector like, for example, a bond wire (not to be seen in the Figure) is exposed at a bottom surface of the cavity 34A of the encapsulant 34. The bond wire can be connected with the gate pad of the semiconductor transistor die.

The semiconductor module 200 further comprises a printed circuit board (PCB) 150 which is connected to the semiconductor package 30 which can be done by means of a press fit pin like a pogo pin in the same way as was described in connection with FIG. 3 or by soldering, adhesive bonding, or gluing the main surfaces of the PCB and the package together. In the embodiment of FIG. 4, it is provided here that the PCB 150 has outer dimensions which are slightly smaller than inner dimensions of the cavity 34A and that the PCB is inserted into the cavity 34A.

The PCB 150 may comprise a gate driver chip (not to be seen in the Figure) disposed on a main surface which faces the cavity 34A like the embodiment of FIG. 3. Furthermore the PCB 150 may comprise a plurality of passive devices 151 disposed on a main surface which is remote from the cavity 34A. The passive devices 151 can be, for example, resistors, capacitors or coils. Further such passive devices can also be disposed on the main surface facing the cavity 34A.

Figure 5A:
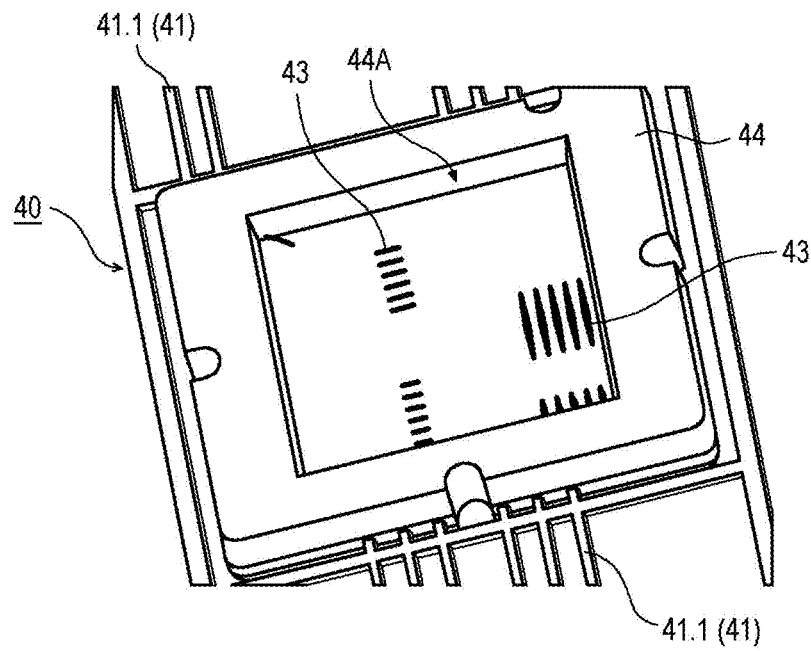
FIG. 5 comprises FIGS. 5A and 5B and shows a perspective view on a semiconductor package which comprises a plurality of exposed wires on the bottom surface of the cavity (A) and a perspective view on a semiconductor module comprising the semiconductor package of FIG. 5A.
Figure 5B:
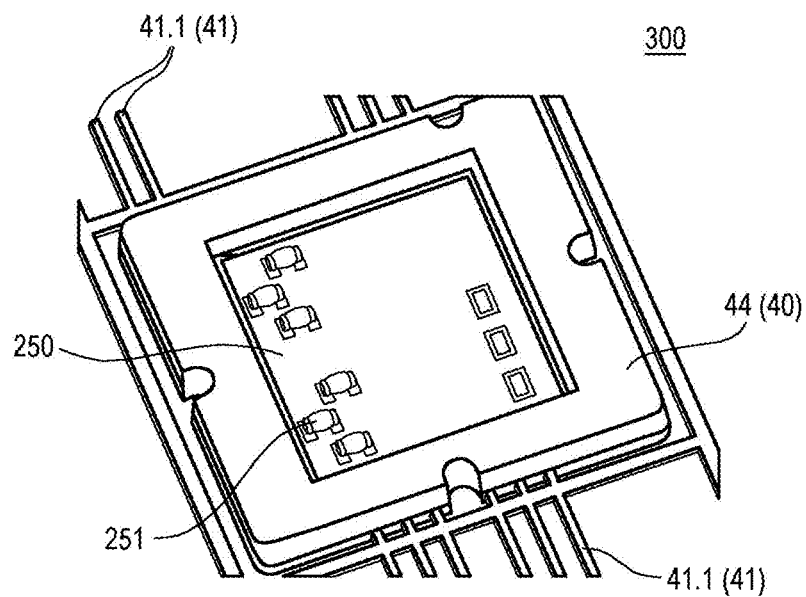

FIG. 5 comprises FIGS. 5A and 5B and shows a perspective view on a semiconductor package which comprises a plurality of exposed wires on the bottom surface of the cavity (A) and a perspective view on a semiconductor module comprising the semiconductor package of FIG. 5A.

The semiconductor package 40 of FIG. 5A can be similar to either one of the semiconductor packages 10 or 20 as were shown and described in connection with FIG. 1 or 2. Accordingly the semiconductor package 40 comprises an encapsulant 44 and a cavity 44A formed into a main surface of the encapsulant 44. In particular, the semiconductor package 40 may comprise a leadframe 41 which comprises a horizontal base plate (not to be seen in the Figure) and external leads 41.1 extending out of the package 30. Two or more semiconductor dies (not to be seen in the Figure) may be disposed on the horizontal base plate of the leadframe 41.

The semiconductor dies may be semiconductor transistor dies like, for example, an IGBT dies or a MOSFET dies, or semiconductor diode dies. The semiconductor transistor dies may each comprise on its upper main face a source pad, a gate pad, and possibly also a source sense pad. A plurality of electrical connectors 43 like, for example, bond wires 43 are exposed at a bottom surface of the cavity 44A of the encapsulant 44. The bond wires 43 can be connected with the gate pads of the semiconductor transistor dies.

The semiconductor module 300 as shown in FIG. 5B comprises the semiconductor package 40 of FIG. 5A and further comprises a printed circuit board (PCB) 250 which is connected to the semiconductor package 30 which can be done by means of a press fit pin like a pogo pin in the same way as was described in connection with FIG. 3 or by soldering, adhesive bonding, or gluing the main surfaces of the PCB and the package together. Like the embodiment of FIG. 4, it is provided here that the PCB 250 has outer dimensions which are slightly smaller than inner dimensions of the cavity 44A and that the PCB 250 is inserted into the cavity 44A.

The PCB 250 may comprise a gate driver chip (not to be seen in the Figure) disposed on a main surface which faces the cavity 44A like the embodiments of FIGS. 3 and 4. Furthermore the PCB 250 may comprise a plurality of passive devices 251 disposed on a main surface which is remote from the cavity 44A. The passive devices 251 can be, for example, resistors, capacitors or coils. Further such passive devices can also be disposed on the main surface facing the cavity 44A.

Figure 6:
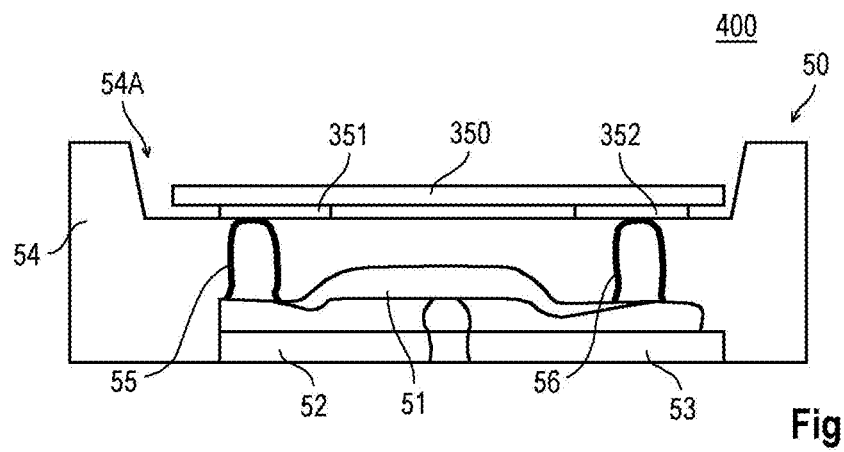
FIG. 6 shows a schematic cross-sectional side view of an example of a semiconductor module which comprises a printed circuit board connected to a semiconductor package in which the semiconductor die comprises a shunt and wire loops are connected to the shunt at two opposing ends thereof.

FIG. 6 shows a schematic cross-sectional side view of an example of a semiconductor module which comprises a printed circuit board connected to a semiconductor package in which the semiconductor die comprises a shunt and wire loops are connected to the shunt at two opposing ends thereof.

The semiconductor package 50 of FIG. 6 can be similar to either one of the semiconductor packages 10 or 20 as were shown and described in connection with FIG. 1 or 2. Accordingly the semiconductor package 50 comprises an encapsulant 54 and a cavity 54A formed into a main surface of the encapsulant 54. In particular, the semiconductor package 40 may comprise further details like the semiconductor packages 10 or 20 of FIG. 1 or 2 like a leadframe, leads, semiconductor dies like semiconductor transistor dies or semiconductors diode dies. However, more important with the embodiment of FIG. 6 is the following.

The semiconductor package 50 namely further comprises a shunt 51 which is connected between two power contacts 52 and 53, the shunt 51 being provided to allow current measurements. To this end, the shunt 51 is connected on opposing ends thereof by respective two solder layers to the two power contacts 56 and 57. Moreover, two wire loops 55 and 56 are attached on opposing ends of the shunt 51 above the two power contacts 52 and 53.

The semiconductor module 400 comprises the semiconductor package 50 and further comprises a printed circuit board (PCB) 350 which is connected to the semiconductor package 40 which can be done as was described before in connection with the embodiments of FIGS. 3 to 5. Like the embodiments of FIG. 4 or, it is provided here that the PCB 250 has outer dimensions which are smaller than inner dimensions of the cavity 54A and that the PCB 350 is inserted into the cavity 54A.

The PCB 350 further comprises two contact pads 351 and 352 at a lower main face thereof, the two contact pads 351 and 352 being connected to the two wire loops 55 and 56 of the semiconductor package 50. The two contact pads 351 and 352 can be connected with an appropriate circuitry to determine the measured current.

It should be mentioned that instead the wire loops 55 and 56 also simple linear bonds like bond wires can be used. However, it is has been shown that the use of wire loops 55 and 56 is advantageous in terms of a very low error in the current measurement.

Figure 7A:
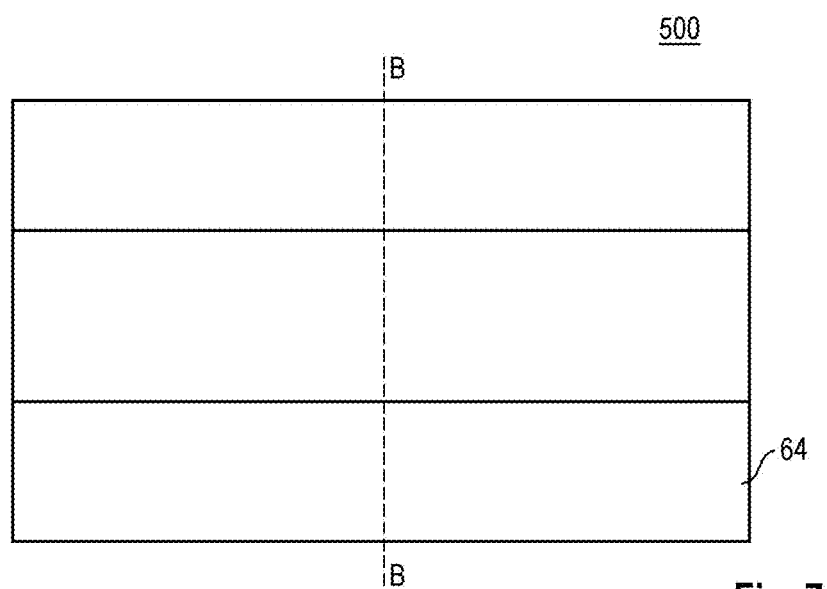
FIG. 7 comprises FIG. 7A to 7C and shows a semiconductor module in a top view (A) and a cross-sectional side view (B) in which module the recess of the semiconductor package extends along one lateral dimension until opposing edges of the encapsulant, and a top view of a semiconductor module in which the PCB extends to a neighboring semiconductor package.
Figure 7B:
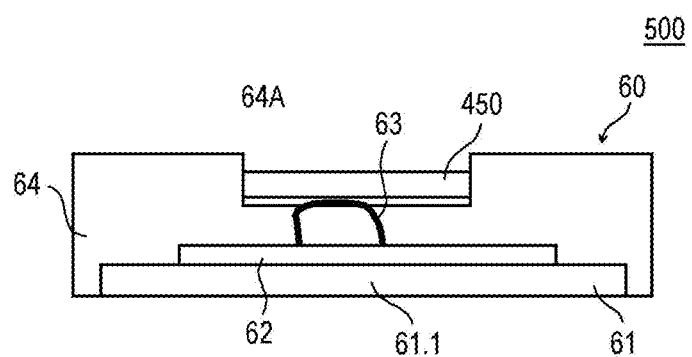
Figure 7C:
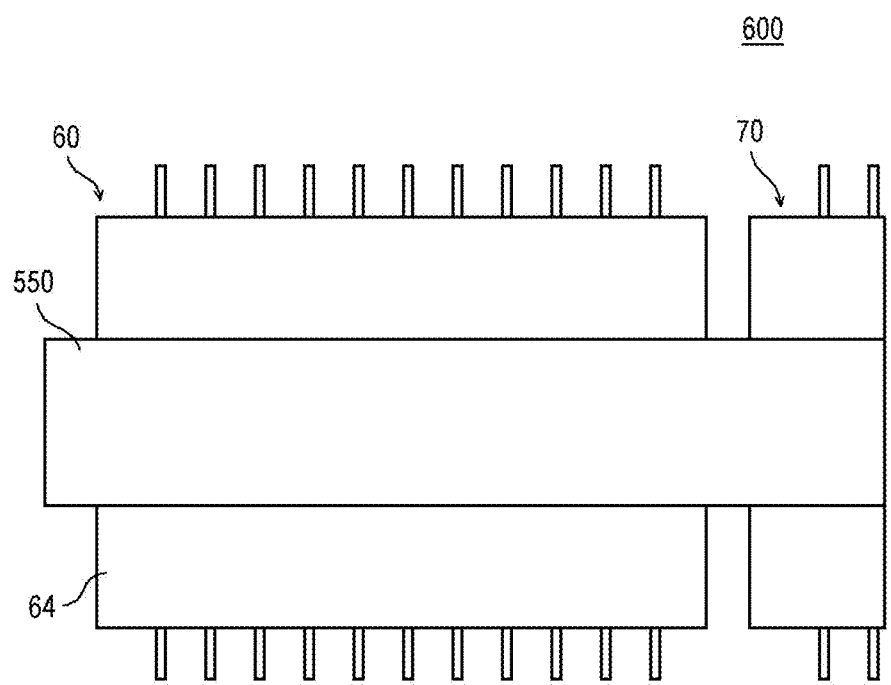

FIG. 7 comprises FIG. 7A to 7C and shows a semiconductor module in a top view (A) and a cross-sectional side view (B) along line B-B- in FIG. 7A, in which module the recess of the semiconductor package extends along one lateral dimension until opposing edges of the encapsulant, and a top view of a semiconductor module in which the PCB extends to a neighboring semiconductor package (C).

The semiconductor module 500 of FIG. 7 comprises a semiconductor package 60 which can be similar to either one of the semiconductor packages 10 or 20 as were shown and described in connection with FIG. 1 or 2. Accordingly the semiconductor package 60 comprises an encapsulant 64 and a cavity 64A formed into a main surface of the encapsulant 64. In particular, the semiconductor package 60 may comprise a leadframe 61 which comprises a horizontal base plate 61.1 and external leads (not shown) extending out of the package 60. At least one semiconductor die 62 may be disposed on the horizontal base plate 61.1 of the leadframe 61 which semiconductor die 62 may be a semiconductor transistor die like, for example, an IGBT die or a MOSFET die. The semiconductor transistor die 62 may comprise on its upper main face a source pad, a gate pad, and possibly also a source sense pad. An electrical connector like 63, for example, a bond wire 63 is exposed at a bottom surface of the cavity 64A of the encapsulant 64. The bond wire 63 can be connected with the gate pad of the semiconductor transistor die.

The semiconductor package 60 differs from the semiconductor packages of the previous embodiments insofar as the recess 64a extends until opposing edges of the encapsulant 64 as can be seen in FIG. 7A.

The semiconductor module 500 further comprises a printed circuit board (PCB) 450 which is connected to the semiconductor package 60 which can be done by means of a press fit pin like a pogo pin in the same way as was described in connection with FIG. 3 or by soldering, adhesive bonding, or gluing the main surfaces of the PCB 450 and the package 60 together. In the embodiment of FIG. 7, it is provided here that the PCB 450 has outer dimensions which are slightly smaller than inner dimensions of the cavity 64A and that the PCB 450 is inserted into the cavity 64A.

The PCB 450 may comprise a gate driver chip (not shown) disposed on a main surface which faces the cavity 64A like the embodiment of FIG. 3. Furthermore the PCB 450 may comprise a plurality of passive devices (not shown) disposed on a main surface which is remote from the cavity 64A. The passive devices can be, for example, resistors, capacitors or coils. Further such passive devices can also be disposed on the main surface facing the cavity 64A.

The semiconductor module 600 of FIG. 7C comprises a semiconductor package 60 which can be similar to the semiconductor package 60 of FIGS. 7A and 7B so that equal reference numbers were used. The semiconductor package 60 is arranged in a lateral side-by-side relationship with another semiconductor package 70 which can be designed in a similar way as the semiconductor package 60. Furthermore the semiconductor module 600 comprises a PCB 550 which extends beyond the opposing edges of the semiconductor package 60 and even extends into the recess of the neighboring semiconductor package 70. Besides that the PCB 550 can have similar properties as the PCB 450 of FIGS. 7A and 7B.

It should further be mentioned that any examples, embodiments, features, comments, or remarks mentioned above in connection with a power module are to be understood as also disclosing a respective method step for providing or fabricating the respective device feature.

EXAMPLES

In the following specific examples of the present disclosure are described.

Example 1 is a semiconductor package, comprising a substrate, at least one semiconductor die disposed on the substrate, at least one electrical connector connected with the semiconductor die, an encapsulant covering the substrate, the at least one semiconductor die, and at least partially the electrical connector, the encapsulant comprising a recess (14A) formed into a main surface of the encapsulant, wherein the at least one electrical connector is exposed within the recess.

Example 2 is the semiconductor package according to Example 1, wherein the semiconductor die comprises at least one contact pad, and the electrical connector is connected with both of its ends with the contact pad.

Example 3 is the semiconductor package according to Example 1, further comprising a dummy pad, wherein the semiconductor die comprises at least one contact pad and the electrical connector is connected with one end with the contact pad and with another end with the dummy pad.

Example 4 is the semiconductor package according to any one of the preceding Examples, wherein the semiconductor die is a semiconductor transistor die comprising one or more of a source pad, a gate pad, and a source sense pad, and the electrical connector (13) is connected with the source pad, the gate pad, or the source sense pad.

Example 5 is the semiconductor package according to Example 1, wherein the semiconductor die comprises a shunt and the electrical connector is connected with the shunt.

Example 6 is the semiconductor package according to any one of the preceding Examples, wherein the electrical connector is one of a wire, a ribbon or a clip.

Example 7 is the semiconductor package according to any one of the preceding Examples, wherein a height of the recess is less than half of the height of the encapsulant.

Example 8 is the semiconductor package according to any one of the preceding Examples, further comprising one or more of a press fit pin, a pogo pin, or a solder pad, one of which being connected to the exposed electrical connector.

Example 9 is the semiconductor package according to any one of the preceding Examples, wherein the material of the electrical connector is based on Al, Cu, or Au.

Example 10 is the semiconductor package according to any one of the preceding Examples, wherein the semiconductor die is based on Si, SiC, or GaN.

Example 11 is the semiconductor package according to any one of the preceding Examples, wherein the recess extends along one lateral dimension until opposing edges of the encapsulant.

Example 12 is the semiconductor package according to any one of the preceding Examples, wherein the electrical connector is exposed at a bottom surface of the recess.

Example 13 is a semiconductor module, comprising a semiconductor package comprising a substrate, at least one semiconductor die disposed on the substrate, the semiconductor die comprising at least one electrical connector, an encapsulant covering the substrate, the at least one semiconductor die, and at least partially the electrical connector, the encapsulant comprising a recess formed into a main surface of the encapsulant, wherein the at least one electrical connector is exposed within the recess, and a printed circuit board disposed in or on the recess, the printed circuit board comprising a semiconductor driver die disposed thereon, the semiconductor driver die being electrically connected with the exposed electrical connector.

Example 14 is the semiconductor module according to Example 13, wherein the printed circuit board further comprises one or more passive devices disposed thereon, the one or more passive devices being at least partially electrically connected with further exposed electrical connectors.

Example 15 is the semiconductor module according to Example 13 or 14, wherein the printed circuit board is connected to the encapsulant by means of one or more of a press fit pin, a pogo pin, or a solder pad, one of which being connected to the exposed electrical connector.

Example 16 is the semiconductor module according to Example 15, wherein the one or more of a press fit pin, a pogo pin, or a solder pad, is connected to the exposed electrical connector.

Example 17 is according to any one of Examples 13 to 16, wherein a height of the recess is less than half of the height of the encapsulant.

Example 18 is the semiconductor module according to any one of Examples 13 to 17, wherein the recess extends along one lateral dimension until opposing edges of the encapsulant.

Example 19 is the semiconductor module according to Example 18, wherein the PCB extends between the opposing edges of the encapsulant or beyond one or both of the opposing edges of the encapsulant.

Example 20 is the semiconductor module according to any one of the Examples, wherein the electrical connector is exposed at a bottom surface of the recess.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A semiconductor package, comprising
a substrate;
at least one semiconductor die disposed on the substrate;
at least one electrical connector connected with the semiconductor die;
an encapsulant covering the substrate, the at least one semiconductor die, and at least partially the electrical connector, the encapsulant comprising a recess formed into a main surface of the encapsulant;
wherein the electrical connector is one of a wire, a ribbon or a clip,
wherein the recess comprises a bottom surface formed by the encapsulant,
wherein the at least one electrical connector is exposed within the recess such that the electrical connector protrudes out from the bottom surface of the recess that is formed by the encapsulant.

2. The semiconductor package according to claim 1, wherein
the semiconductor die comprises at least one contact pad, and wherein the at least one electrical connector comprises two ends that are each connected with the contact pad.

3. The semiconductor package according to claim 1, further comprising a dummy pad, wherein the semiconductor die comprises at least one contact pad and the at least one electrical connector is connected with one end with the contact pad and with another end with the dummy pad.

4. The semiconductor package according to claim 1, wherein the semiconductor die is a semiconductor transistor die comprising one or more of a source pad, a gate pad, and a source sense pad, and the at least one electrical connector is connected with the source pad, the gate pad, or the source sense pad.

5. The semiconductor package according to claim 1, wherein
the semiconductor die comprises a shunt and the at least one electrical connector is connected with the shunt.

6. The semiconductor package according to claim 1, wherein a height of the recess is less than half of the height of the encapsulant.

7. The semiconductor package according to claim 1, further comprising one or more of a press fit pin, a pogo pin, or a solder pad, one of which being connected to the at least one electrical connector.

8. The semiconductor package according to claim 1, wherein the material of the at least one electrical connector is based on Al, Cu, or Au.

9. The semiconductor package according to claim 1, wherein the semiconductor die is based on Si, SiC, or GaN.

10. The semiconductor package according to claim 1, wherein the recess extends along one lateral dimension to reach opposing edges of the encapsulant.

11. A semiconductor module comprising
a semiconductor package, comprising
a substrate;
at least one semiconductor die disposed on the substrate, the semiconductor die comprising at least one electrical connector;
an encapsulant covering the substrate, the at least one semiconductor die, and at least partially the electrical connector, the encapsulant comprising a recess formed into a main surface of the encapsulant;

wherein the electrical connector is one of a wire, a ribbon or a clip, wherein the recess comprises a bottom surface formed by the encapsulant, wherein the at least one electrical connector is exposed within the recess such that the at least one electrical connector protrudes out from the bottom surface of the recess that is formed by the encapsulant; and a printed circuit board disposed in or on the recess, the printed circuit board comprising a semiconductor driver die disposed thereon, the semiconductor driver die being electrically connected with the at least one electrical connector.

12. The semiconductor module according to claim 11, wherein
the printed circuit board further comprises one or more passive devices disposed thereon, the one or more passive devices being at least partially electrically connected with a further one of the electrical connectors.

13. The semiconductor module according to claim 11, wherein the printed circuit board is connected to the encapsulant by means of one or more of a press fit pin, a pogo pin, or a solder pad, one of which being connected to the at least one electrical connector.

14. The semiconductor module according to claim 11, wherein a height of the recess is less than half of the height of the encapsulant.

15. The semiconductor module according to claim 11, wherein the recess extends along one lateral dimension until opposing edges of the encapsulant.

16. The semiconductor module according to claim 11, wherein
the printed circuit board extends between opposing edges of the encapsulant or beyond one or both of the opposing edges of the encapsulant.

* * * * *